(12) United States Patent
Cananzi

(10) Patent No.: US 10,779,449 B1
(45) Date of Patent: Sep. 15, 2020

(54) FAN WITH EMI ABSORBENT BLADES

(71) Applicant: Arista Networks, Inc., Santa Clara, CA (US)

(72) Inventor: David A. Cananzi, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/381,615

(22) Filed: Apr. 11, 2019

(51) Int. Cl.
*H05K 9/00* (2006.01)
*H05K 7/20* (2006.01)

(52) U.S. Cl.
CPC ....... *H05K 9/0084* (2013.01); *H05K 7/20145* (2013.01); *H05K 7/20172* (2013.01)

(58) Field of Classification Search
CPC ............ H05K 9/0084; H05K 7/20145; H05K 7/20172
See application file for complete search history.

(56) References Cited

U.S. PATENT DOCUMENTS

| | | | | | |
|---|---|---|---|---|---|
| 6,186,889 | B1* | 2/2001 | Byrne | .................. | G06F 1/20 361/695 |
| 6,462,436 | B1* | 10/2002 | Kay | .................. | H04B 15/02 307/91 |
| 7,411,788 | B2* | 8/2008 | Liang | .................. | H05K 7/20172 361/694 |
| 8,451,605 | B2* | 5/2013 | Chen | .................. | H05K 7/20172 361/679.48 |
| 2003/0138684 | A1* | 7/2003 | Tinker | .................. | H01M 2/10 429/403 |
| 2004/0020674 | A1* | 2/2004 | McFadden | .................. | H05K 9/0088 174/394 |
| 2006/0152901 | A1* | 7/2006 | Espinoza-Ibarra | ... | F04D 29/382 361/695 |
| 2007/0242443 | A1* | 10/2007 | Hailey | .................. | H05K 7/20172 361/818 |
| 2010/0323138 | A1* | 12/2010 | Yoshioka | .................. | D02G 3/06 428/36.1 |
| 2011/0103981 | A1* | 5/2011 | Horng | .................. | F04D 25/0606 417/423.7 |
| 2011/0186324 | A1* | 8/2011 | Hur | .................. | H05K 9/0088 174/34 |
| 2012/0281354 | A1* | 11/2012 | Rothkopf | .................. | G06F 1/203 361/679.48 |
| 2014/0099195 | A1* | 4/2014 | Jun | .................. | F04D 25/0613 415/182.1 |
| 2015/0102682 | A1* | 4/2015 | Wang | .................. | H01F 38/14 307/104 |
| 2018/0068761 | A1* | 3/2018 | Chin | .................. | H01B 11/203 |

OTHER PUBLICATIONS

Zhu, Weimo, et al. "Electromagnetic and Microwave-Absorbing Properties of Magnetic Nickel Ferrite Nanocrystals." Nanoscale, The Royal Society of Chemistry, Jun. 1, 2011, https://pubs.rsc.org/en/content/articlelanding/2011/nr/c1nr10274e#!divRelatedContent&articles. (Year: 2011).*

* cited by examiner

*Primary Examiner* — Abhishek M Rathod
(74) *Attorney, Agent, or Firm* — Fountainhead Law Group, PC

(57) ABSTRACT

An air-moving device with electromagnetic interference (EMI) reduction is provided. The air moving device, which may be embodied as a fan, includes a motor, one or more blades coupled to the motor, and each of the one or more blades comprising EMI absorbent material.

19 Claims, 3 Drawing Sheets

FAN WITH EMI ABSORBENT BLADES

BACKGROUND

Electromagnetic interference (EMI) is problematic, both in the form of EMI radiated from electronic devices, and susceptibility of electronic devices to EMI from other sources. Conventionally, an electrically conductive chassis more or less completely surrounding electronic components and circuitry acts as a Faraday cage to shield the circuits from external EMI, and prevent EMI from escaping. Frequently, electronic circuits need cooling, which is often addressed with the use of one or more fans as air moving devices with impellers, usually electrically driven. An aperture large enough to support airflow into or out of an enclosure, and mounting of a fan, is often large enough to allow EMI to enter or exit the enclosure. Therefore, there is a need in the art for a solution which overcomes the drawbacks described above.

SUMMARY

In some embodiments, an air-moving device with electromagnetic interference (EMI) reduction is provided. The air moving device, which may be embodied as a fan, includes a motor, one or more blades coupled to the motor, and each of the one or more blades comprising EMI absorbent material.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Electromagnetic interference (EMI) and emission is a problem for networking and other electronic equipment. Typically, high-power and bandwidth networking and other electronic equipment produce significant amounts of electromagnetic noise that can interfere with other networking and other electronic equipment; therefore, it must be contained. A well-grounded conductive chassis partially solves this issue. However, in many situations the chassis requires apertures for fans for cooling. Fans are effectively wide apertures that allow electromagnetic radiant to leak through. One approach to reduce EMI is to employ a honeycomb structure for the aperture, but these structures may be expensive, and restrict airflow.

The embodiments implemented herein provide fan blades coated with an EMI absorbent material that can absorb electromagnetic waves. This architecture implements a magnetic field attenuation strategy. Attenuating the magnetic component of an electromagnetic (EM) wave benefits overall EMI reduction. With the fan blades made of or having EMI absorbent material, the fan can now block EMI and continue to operate with the same airflow. One embodiment uses ferrite material as EMI absorbent material technology. In some embodiments, the same EMI absorbent material that is used to coat the interior of a chassis and absorb electromagnetic fields is used to coat the fan or impeller.

In some embodiments, the fan blades are three-dimensional, for example, in some embodiments the fan blades may be similar to an auger. Therefore coating the blades with an EMI absorbent material effectively creates a wall. When the fan spins the rotating blades can still pull air, but to a travelling electromagnetic wave a barrier is present, and the blades attenuate the electromagnetic wave.

Figure 1A:
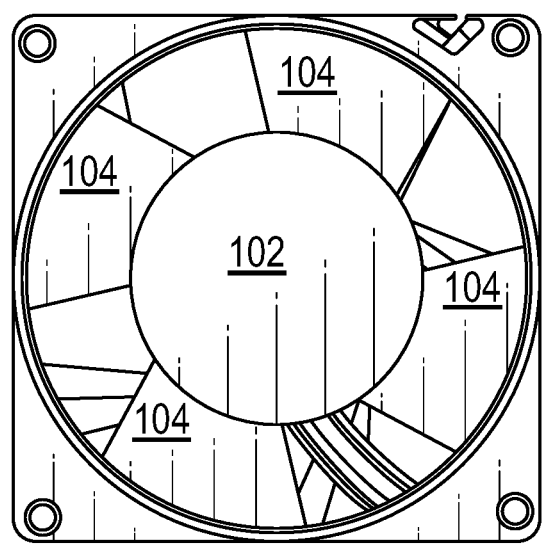
FIG. 1A illustrates a plan view of a fan, showing a hub with multiple blades in accordance with some embodiments.

FIG. 1A illustrates a fan, showing hub 102 with multiple blades 104 attached or integral to hub 102. Generally, the hub and blades of a fan may be referred to as an impeller. This type of fan is often used for cooling electronics in an enclosure (see FIG. 2). In this embodiment, the fan has blades 104 with EMI absorbent material (see FIG. 3), to reduce EMI. Depending on airflow direction and requirements, blades 104 could be larger, smaller, more numerous, less numerous, etc., and could rotate clockwise or counterclockwise. Variations could have a larger or smaller diameter hub 102, larger or smaller overall dimensions, and various types of chassis, mountings for the chassis, etc.

Figure 1B:
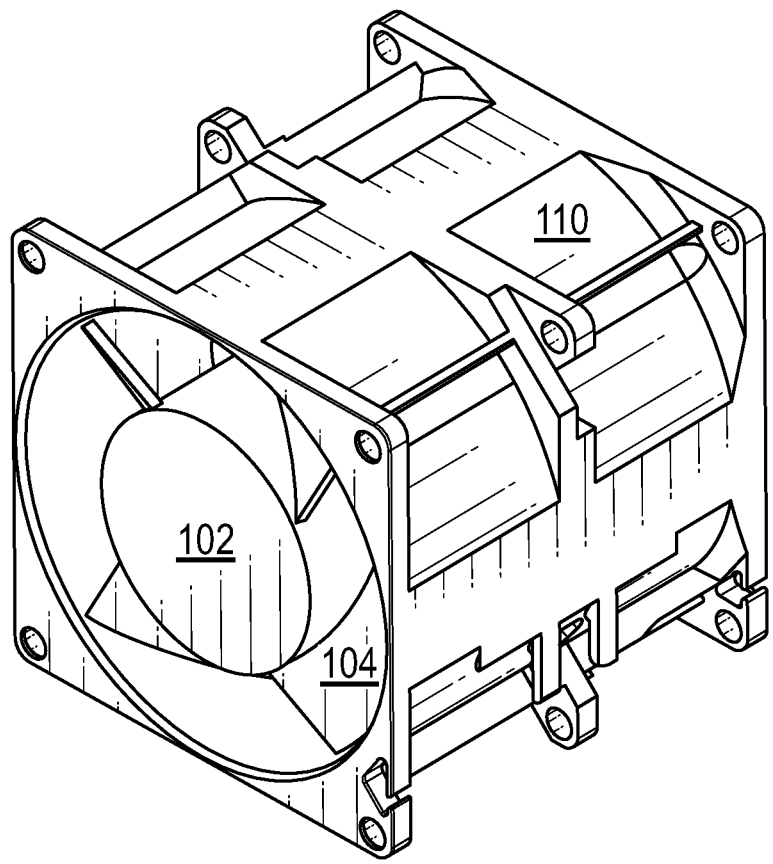
FIG. 1B illustrates a perspective view of the fan of FIG. 1A in accordance with some embodiments.

FIG. 1B illustrates another view of the fan of FIG. 1A in accordance with some embodiments. From this viewing angle, fan housing 110 is visible, with hub 102 and blades 104 at one end of fan housing 110. An electric motor is inside fan housing 110 and drives hub 102, rotating fan blades 104 to produce airflow. In this version, the airflow is in the direction of the arrow on the side of fan housing 110, but could be reversed, or reversible, in various further versions. Embodiments are not limited to an electric motor, and other types of motors could be integrated with the embodiments described herein. In addition, varying types of fan blade configurations may be integrated with the embodiments.

Figure 2:
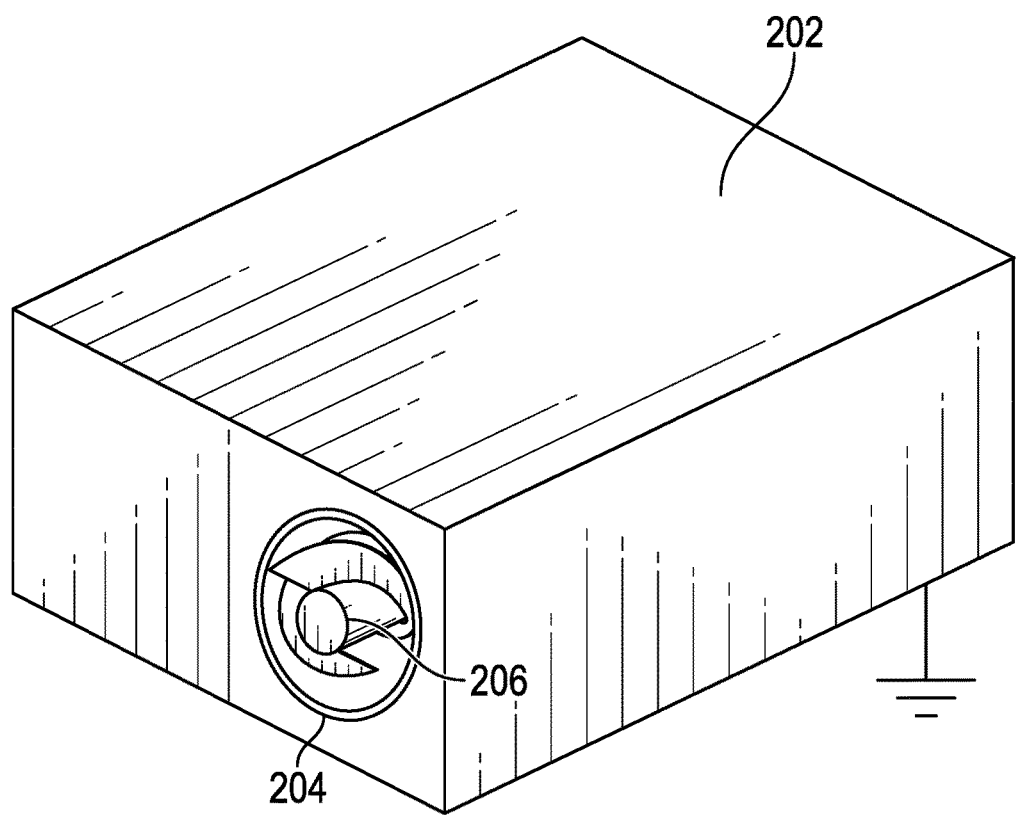
FIG. 2 is a perspective view of an enclosure with a fan in accordance with some embodiments.

FIG. 2 is a view of enclosure 202 with fan 206. Various electronic circuits, electrical or electronic components, etc., are mounted in the interior of enclosure 202, and cooled by airflow into or out of enclosure 202 produced by motorized fan 206. In one embodiment, enclosure 202 has an electrical ground, for EMI shielding of the contents of enclosure 202. In one embodiment, the fan blades are electrically connected to the chassis and to the electrical ground, so that both the fan blades and enclosure 202 improve EMI shielding. For example, the fan blades could be made of electrically conductive metal, in electrical contact with a motor shaft, which is further in electrical contact with fan housing 110, and which in turn electrically contacts enclosure 202. Still further improvement for EMI shielding is provided by the EMI absorbent material coating the fan blades. In other versions, the fan blades are electrically insulated, isolated from or floating relative to enclosure 202. The electrical circuits and electrical components within enclosure 202 may provide functionality not limited to switching, routing, computer processing, data processing, and any other type of electrical processing functionality which may include functionality not requiring a computing device.

Figure 3:
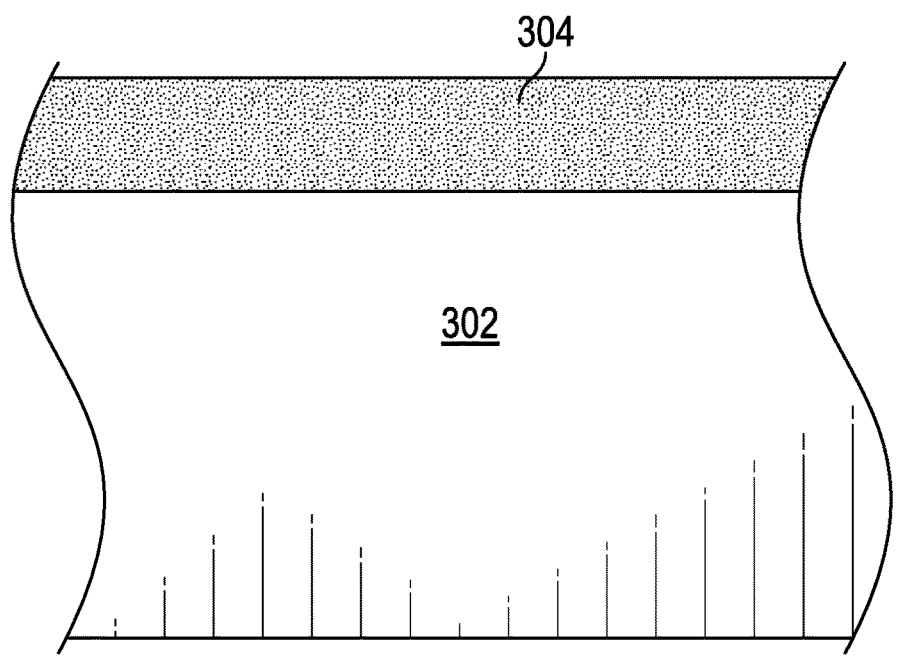
FIG. 3 is a cross-section view depicting an EMI absorbent material coating a fan blade, in accordance with present embodiments in accordance with some embodiments.

FIG. 3 is a cross-section view depicting EMI absorbent material 304 coating fan blade 302, in accordance with present embodiments. It should be appreciated that the drawing of FIG. 3 is expressly not to scale, and various thicknesses, amounts and types of EMI absorbent material 304 can be used in embodiments. EMI absorbent material 304 could coat one side, both sides, or the entirety of the surface area of fan blade 302, and portions or all of the hub or shaft for the fan blade, in various embodiments. The entire surface area of fan blade 302 could be made of EMI absorbent material 304, in a further embodiment. EMI absorbent material 304 can be any suitable EMI absorbing material or EMI suppression products, such as ferrite beads, metal foam, etc. In yet other embodiments, fan blades 104 (and/or hub 102) may comprise an EMI absorbent material 304 dispersed throughout another material with sufficient density to accomplish the EMI absorption desired for the application. In still further embodiments, fan blades 104 and/or hub 102 may consist of EMI absorbent material. The fan blades may be configured in any suitable geometry to obtain a reduction of EMI and are not limited to the depicted geometries.

Some embodiments use a ferromagnetic material for the EMI absorbent material 304. EMI absorbent material 304 is a magnetic field attenuation material, in some embodiments. Some embodiments use ferrite, a type of iron. Some embodiments use powdered iron, or powdered ferrite. Powders, granules, microspheres and other forms of ferromagnetic material can be mixed with a filler, bonding agent, glue or resin that hardens into an EMI absorbent coating after being applied to fan blade 302. The application of the EMI absorbent material may be accomplished through powder coating processes in some embodiments. It should be appreciated that the examples provided herein for the EMI absorbent material are not meant to be limiting as any commercially available EMI absorbent material may be integrated with the air moving device provided herein.

In some embodiments, EMI absorbent material 304 has relatively small magnetic domains, on the order of microscale or nanoscale. These magnetic domains have unaligned magnetic dipoles. Energy is taken from an electromagnetic wave to force alignment on these materials. The electromagnetic wave gives up energy to try to align the unaligned dipoles and is the mechanism for some materials to absorb or attenuate an electromagnetic wave.

Figure 4:
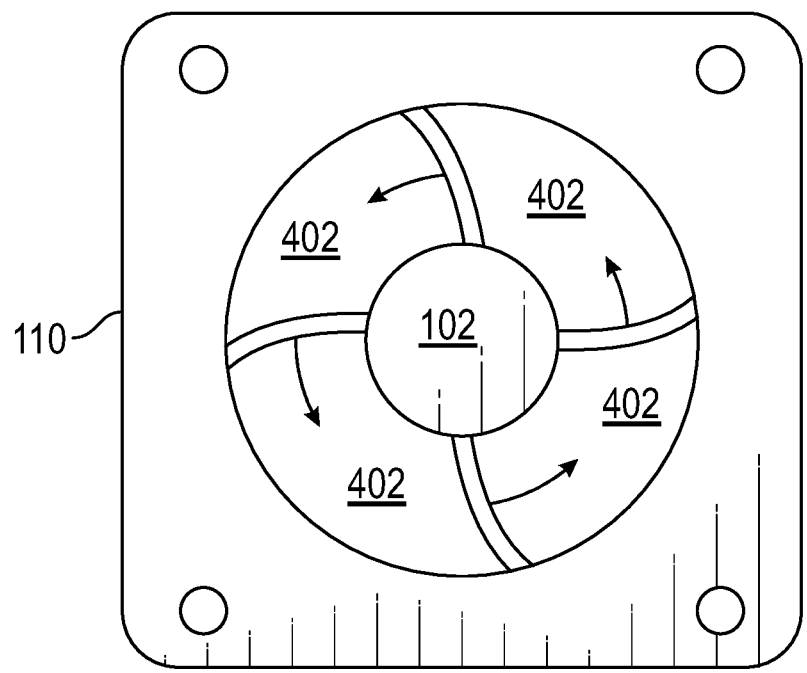
FIG. 4 depicts overlapping blades of an embodiment of the fan in accordance with some embodiments.

FIG. 4 depicts overlapping blades 402 of an embodiment of the fan. Some fans have blades 104 with a gap between blades 104 (see FIG. 1A). In the embodiment of FIG. 4, overlapping blades 402 close the gap to further improve EMI shielding, although a gap may be seen between blades 402 when viewed at some angles. This gap may be further decreased with larger overlap in some embodiments. Various gap sizes may be integrated with the embodiments and attenuate the EMI as described herein. In some embodiments, the gap is approximately the quarter wavelength of the upper bound of frequencies to be rejected times the fan frequency, i.e., Lamba/4*(1−A.impeller/A.aperature)(1−f.fan/f.cutoff); assuming the fan and cut-off frequency are in-phase.

Figure 5:
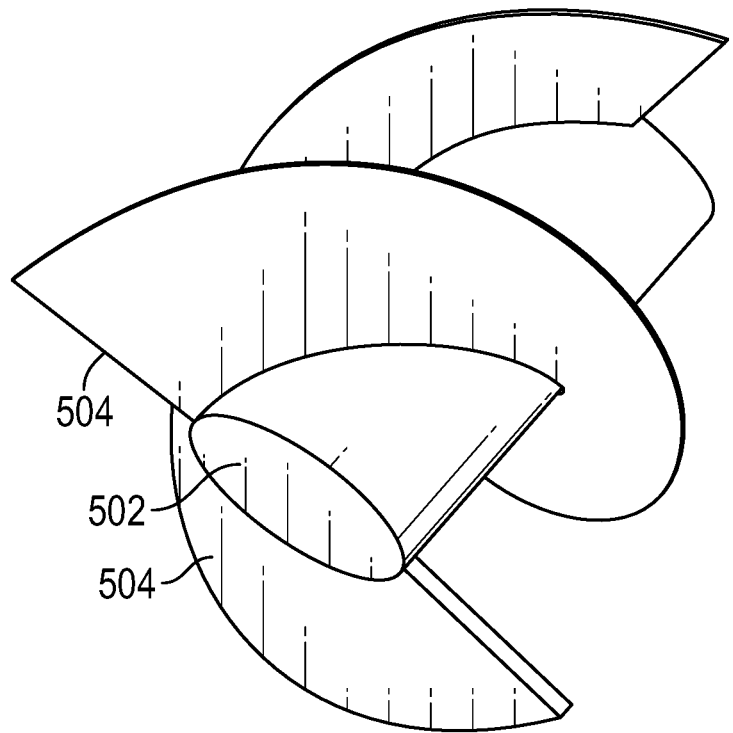
FIG. 5 depicts auger blades of an embodiment of the fan in accordance with some embodiments.

FIG. 5 depicts auger blades 504 of an embodiment of the fan. Blades 504 are similar to screw threads around hub 502 of the auger, and no gap can be seen at any angle of view in some embodiments. With EMI absorbent material coted or applied to the exposed outer surface of auger blades 504, the embodiment of FIG. 5 may provide improved EMI shielding. It should be appreciated that while the embodiment of FIG. 5 depicts two auger blades 504, further embodiments could have a single auger blade, or three or more auger blades. In some embodiments the auger blades may not overlap as depicted in FIG. 5.

Further embodiments could utilize one or more reciprocating blades, driven back and forth by a motor, or blades on a belt. That is the embodiments are not to be limited to the examples of fans provided herein as any air moving devices are candidates for utilization as fans capable of reducing EMI. The attenuation provided through the embodiments may provide various degrees of effectiveness of electromagnetic interference shielding.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A fan, for electromagnetic interference (EMI) reduction, comprising:
   a motor;
   an impeller attached to the motor; and
   the impeller comprising a hub and at least one blade arranged as a screw thread, the impeller configured as an auger and comprising an EMI absorbent material, wherein the at least one blade wraps around the hub for at least half a rotation.

2. The fan of claim 1, wherein the impeller is coated with the EMI absorbent material.

3. The fan of claim 1, further comprising:
   the EMI absorbent material comprising ferrite material having magnetic domains of an order of microscale or nanoscale.

4. The fan of claim 1, further comprising:
   the EMI absorbent material comprising ferrite material having unaligned dipoles.

5. The fan of claim 1, further comprising:
   the EMI absorbent material comprising powdered iron with at least one of a filler, bonding agent, glue or resin.

6. The fan of claim 1, further comprising:
   the impeller comprising electrically conductive metal with an EMI absorbent coating.

7. The fan of claim 1, further comprising:
   the impeller is electrically insulated or electrically connected relative to an enclosure of the fan.

8. The fan of claim 1, wherein the EMI absorbent material comprises a magnetic field attenuation material.

9. The fan of claim 1, wherein the fan is configured to be housed in an enclosure of a computing device.

10. The fan of claim 1, wherein the at least one blade is gapless.

11. A fan-cooled enclosure with electromagnetic interference (EMI) reduction, comprising:
    an electrically grounded enclosure, having an aperture to support airflow, wherein the aperture is of sufficient size to admit EMI;
    a motorized fan coupled to the aperture to support the airflow; and
    the motorized fan having an impeller comprising a hub and at least one blade arranged as a screw thread, the impeller configured as an auger and comprising an EMI absorbent material, wherein the at least one blade wraps around the hub for at least half a rotation.

12. The fan-cooled enclosure of claim 11, further comprising:
    electrical connection of the one or more blades to the enclosure.

13. The fan-cooled enclosure of claim 11, further comprising:
    the one or more blades electrically isolated from or floating relative to the enclosure.

14. The fan-cooled enclosure of claim 11, wherein the one or more blades comprising EMI absorbent material are each coated with ferrite material.

15. The fan-cooled enclosure of claim 11, wherein the EMI absorbent material comprises powdered ferrite.

16. An air-moving device with electromagnetic interference (EMI) reduction, comprising:
    a motor;
    one or more blades arranged as screw threads coupled to a hub, wherein the one or more blades and the hub are configured as an auger and the hub is coupled to the motor, and wherein the one or more blades wrap around the hub for at least half a rotation; and
    each of the one or more blades and the hub consisting of EMI absorbent material.

17. The air-moving device of claim 16, further comprising:
    the one or more blades arranged to rotate, driven by the motor.

18. The air-moving device of claim 16, further comprising:
    the one or more blades arranged to reciprocate, driven by the motor.

19. The air-moving device of claim 16, wherein the EMI absorbent material comprises ferrite in powdered form in at least one of a filler, bonding agent, glue or resin.

* * * * *